(12) United States Patent
Chern et al.

(10) Patent No.: US 9,099,632 B2
(45) Date of Patent: Aug. 4, 2015

(54) LIGHT EMITTING DIODE EMITTER SUBSTRATE WITH HIGHLY REFLECTIVE METAL BONDING

(75) Inventors: Chyi Shyuan Chern, Taipei (TW);
Wen-Chien Fu, Hsinchu (TW);
Hsing-Kuo Hsia, Jhubei (TW);
Chih-Kuang Yu, Chiayi (TW);
Ching-Hua Chiu, Hsinchu (TW);
Hung-Yi Kuo, Taipei (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 31 days.

(21) Appl. No.: 13/476,167

(22) Filed: May 21, 2012

(65) Prior Publication Data

US 2012/0228650 A1     Sep. 13, 2012

Related U.S. Application Data

(63) Continuation of application No. 13/025,975, filed on Feb. 11, 2011, now Pat. No. 8,236,584.

(51) Int. Cl.
*H01L 33/64* (2010.01)
*H01L 23/00* (2006.01)
(Continued)

(52) U.S. Cl.
CPC .............. *H01L 33/647* (2013.01); *H01L 24/97* (2013.01); *H01L 33/005* (2013.01); *H01L 33/62* (2013.01); *H01L 2224/32225* (2013.01); *H01L 2224/48091* (2013.01); *H01L 2224/48227* (2013.01); *H01L 2224/49107* (2013.01); *H01L 2224/73265* (2013.01); *H01L 2224/8592* (2013.01); *H01L 2224/97* (2013.01); *H01L 2924/014* (2013.01); *H01L 2924/01006* (2013.01); *H01L 2924/01013* (2013.01); *H01L 2924/01029* (2013.01); *H01L 2924/01033* (2013.01);
(Continued)

(58) Field of Classification Search
CPC ..... H01L 33/647; H01L 24/97; H01L 33/005; H01L 33/62; H01L 2224/48091; H01L 2924/01013
See application file for complete search history.

(56) References Cited

U.S. PATENT DOCUMENTS 5,391,917 A    2/1995  Gilmour et al.
5,510,298 A    4/1996  Redwine
(Continued)

FOREIGN PATENT DOCUMENTS

KR     10-0764450     10/2007
KR     10-0854328     8/2008

OTHER PUBLICATIONS

Korean Patent Office, Office Action dated Sep. 21, 2012, Application No. 10-2011-0072087, 13 pages with English translation.

*Primary Examiner* — Michael Shingleton
(74) *Attorney, Agent, or Firm* — Muncy, Geissler, Olds & Lowe, P.C.

(57) ABSTRACT

A package structure includes: a substrate having a first side and a second side opposite to the first side; a metal layer disposed over at least a portion of the second side of the substrate; a light-reflective layer disposed over the first side of the substrate; and a photonic device bonded to the light-reflective layer from the first side. A segment of the metal layer extends through the substrate from the first side to the second side, and a portion of the substrate is completely enclosed in a cross-sectional view by the metal layer. The package structure is free of a bonding wire over the second side of the substrate.

20 Claims, 14 Drawing Sheets

(51) Int. Cl.
   *H01L 33/00* (2010.01)
   *H01L 33/62* (2010.01)

(52) U.S. Cl.
   CPC .............. *H01L 2924/01047* (2013.01); *H01L 2924/01049* (2013.01); *H01L 2924/01074* (2013.01); *H01L 2924/10253* (2013.01); *H01L 2924/12041* (2013.01); *H01L 2933/0033* (2013.01)

(56) References Cited

U.S. PATENT DOCUMENTS

| | | | |
|---|---|---|---|
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine et al. | |
| 6,664,129 B2 | 12/2003 | Siniaguine et al. | |
| 6,693,361 B1 | 2/2004 | Siniaguine et al. | |
| 6,740,582 B2 | 5/2004 | Siniaguine | |
| 6,773,938 B2 | 8/2004 | Wood et al. | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,300,857 B2 | 11/2007 | Akram et al. | |
| 7,335,972 B2 | 2/2008 | Chanchani | |
| 7,355,273 B2 | 4/2008 | Jackson et al. | |
| 7,453,093 B2 | 11/2008 | Kim et al. | |
| 7,714,341 B2 | 5/2010 | Chil Keun et al. | |
| 7,786,581 B2 | 8/2010 | Kang et al. | |
| 7,989,237 B2 | 8/2011 | Tseng et al. | |
| 8,048,694 B2 | 11/2011 | Wen et al. | |
| 8,058,669 B2 | 11/2011 | Chen et al. | |
| 8,558,262 B2 * | 10/2013 | Wu et al. | 257/98 |
| 2011/0198646 A1 | 8/2011 | Wu et al. | |
| 2011/0241040 A1 | 10/2011 | Yu et al. | |

* cited by examiner

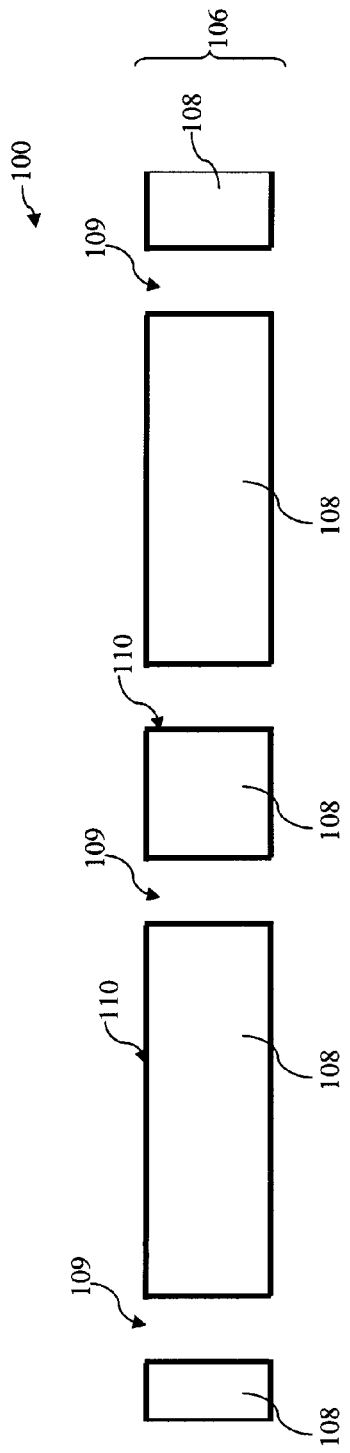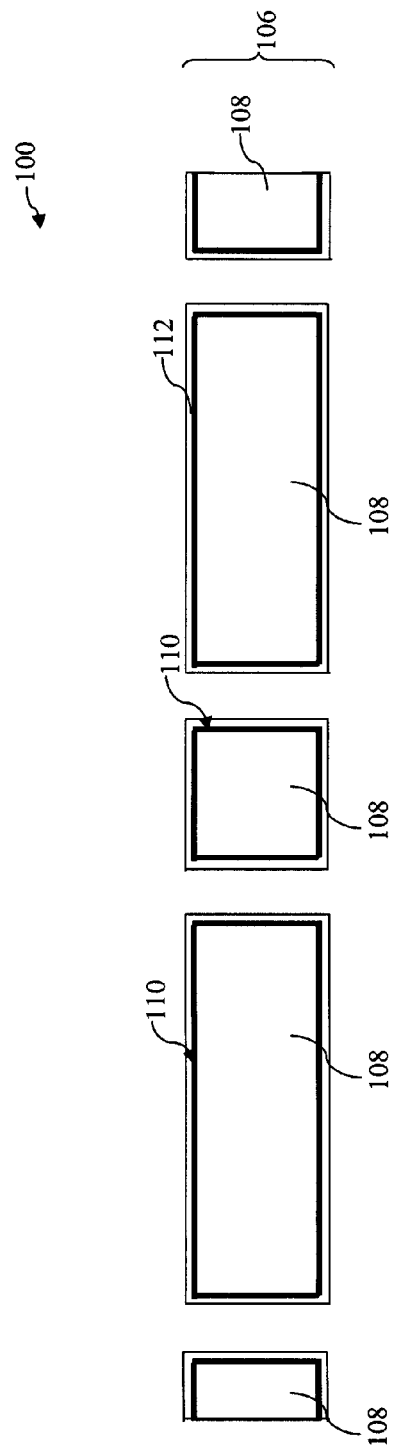

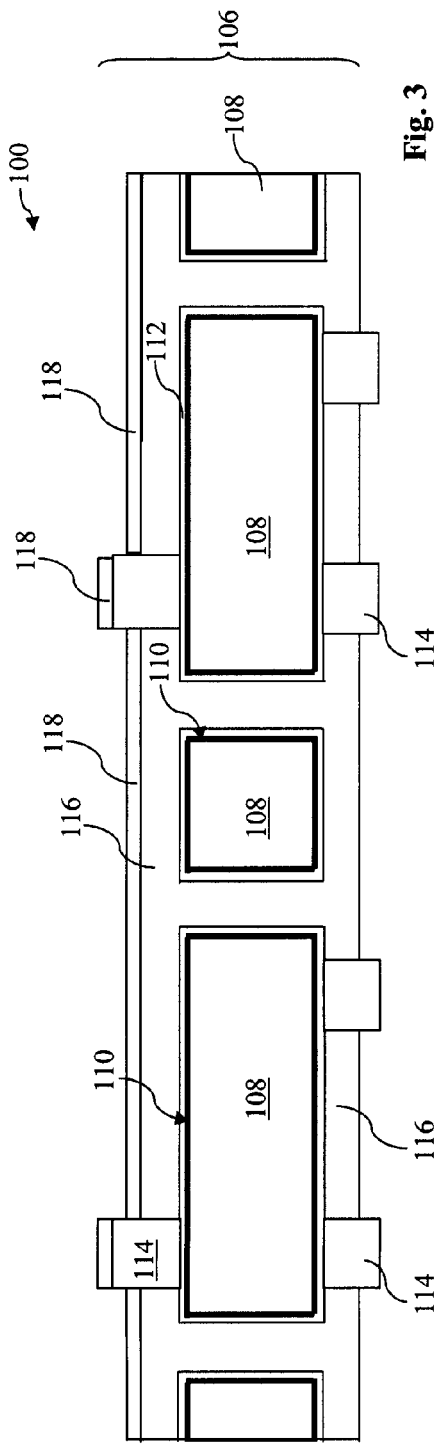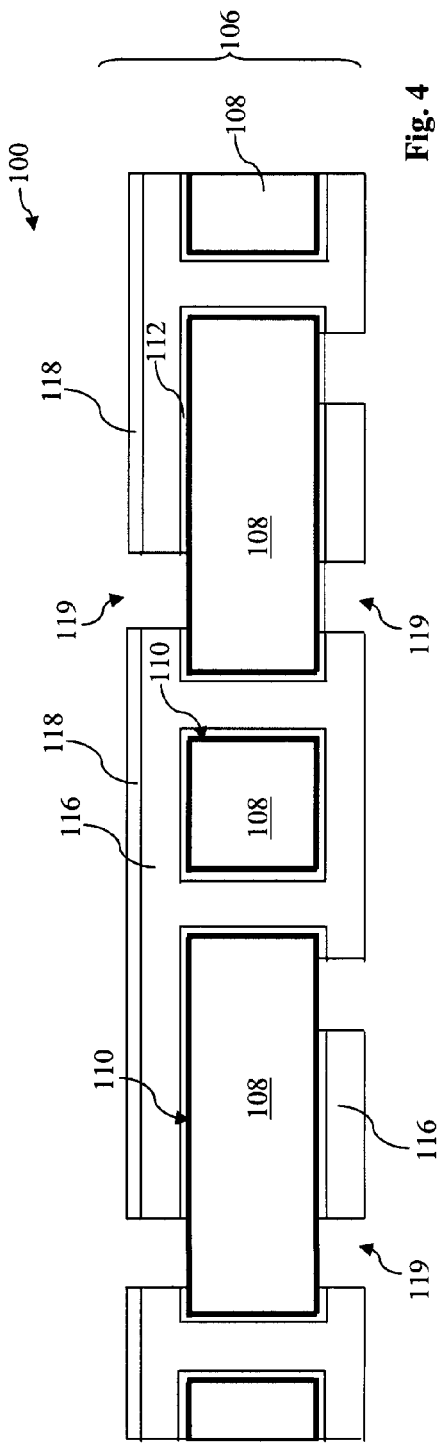

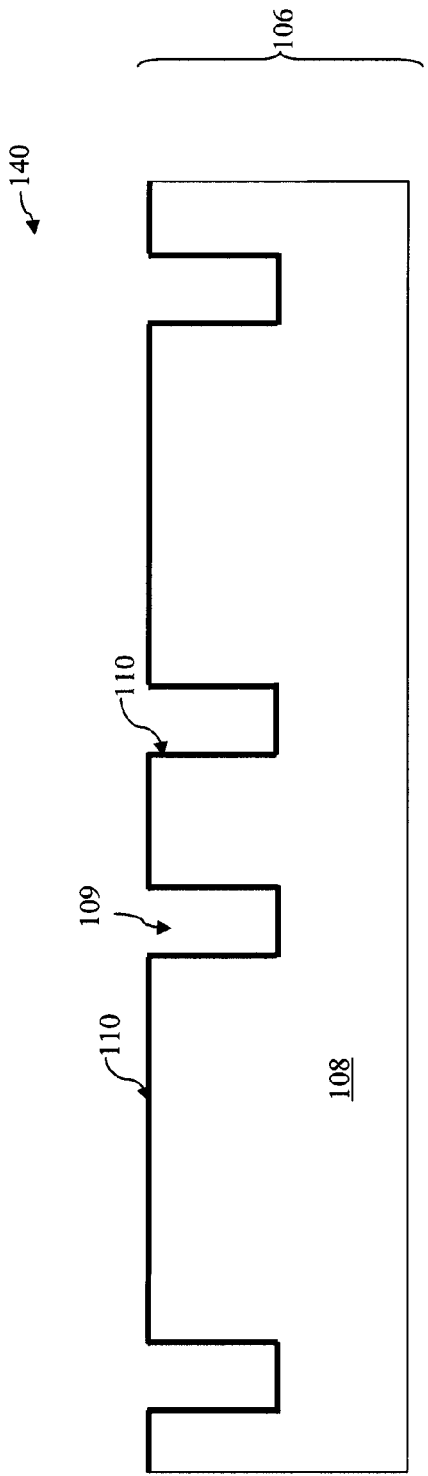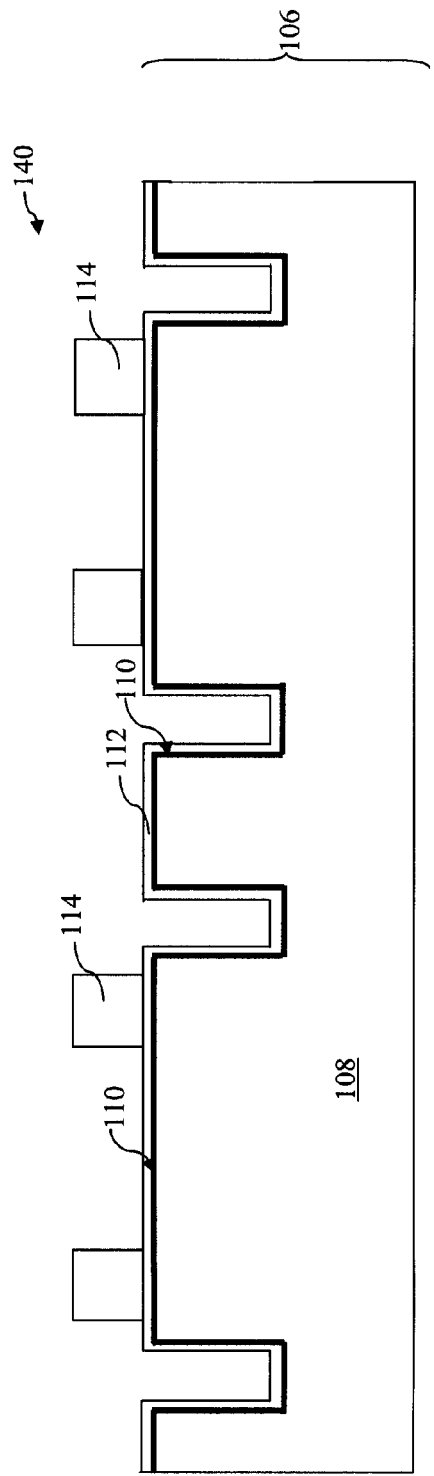

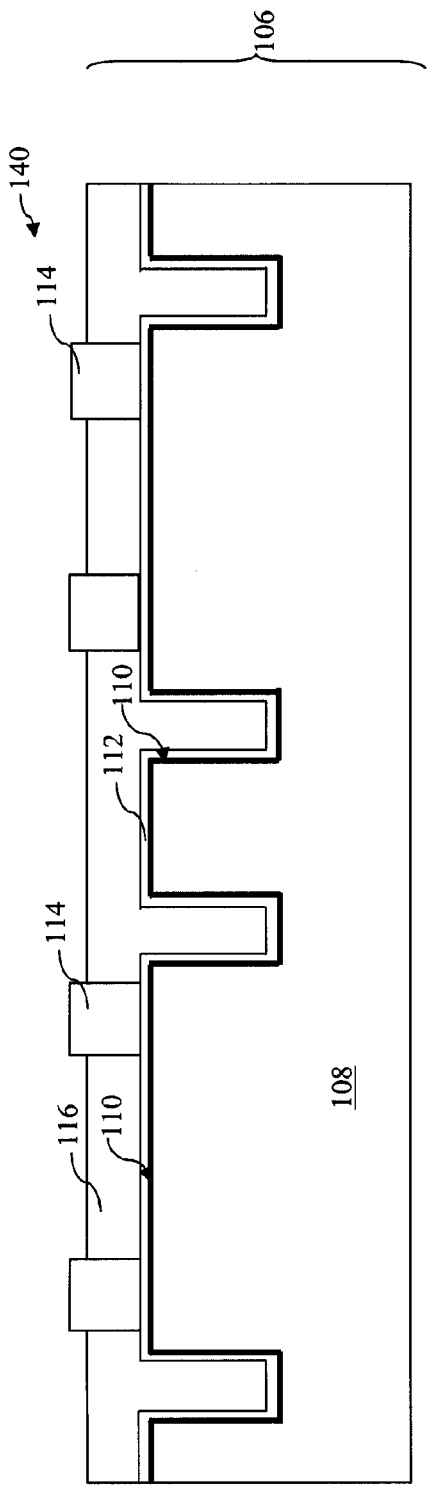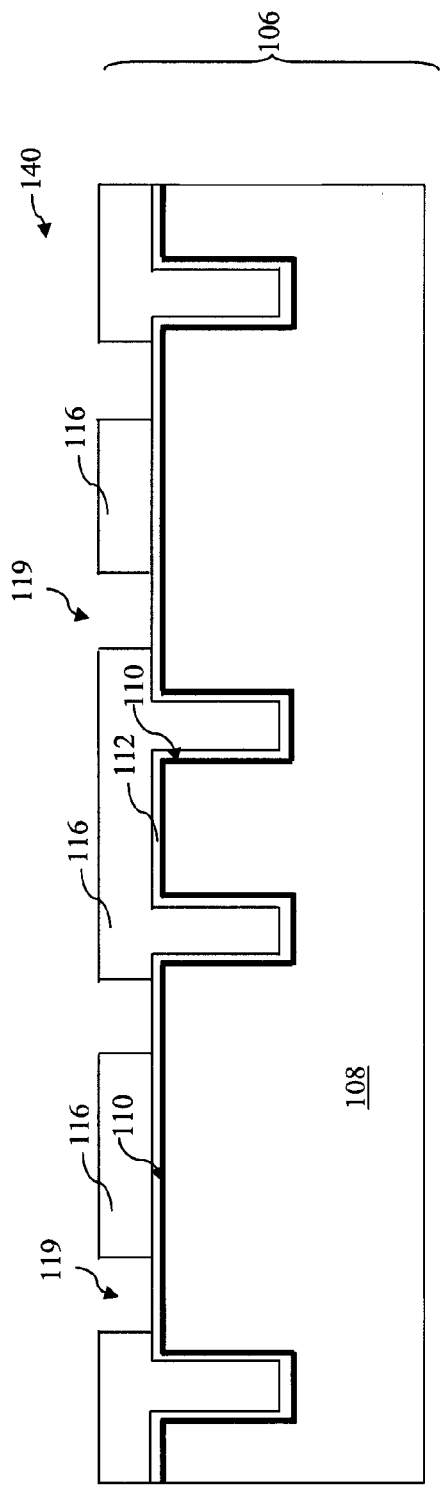

LIGHT EMITTING DIODE EMITTER SUBSTRATE WITH HIGHLY REFLECTIVE METAL BONDING

PRIORITY DATA

This application claims priority to application Ser. No. 13/025,975, filed on Feb. 11, 2011, entitled "LIGHT EMITTING DIODE EMITTER SUBSTRATE WITH HIGHLY REFLECTIVE METAL BONDING," the disclosure of which is incorporated herein by reference in its entirety.

CROSS REFERENCE

The present disclosure is related to the following commonly-assigned U.S. patent application, the entire disclosure of which is incorporated herein by reference: U.S. Ser. No. 13/005,731 filed Jan. 13, 2011 by inventors Ksing-Kuo Hsia et al for "MICRO-INTERCONNECTS FOR LIGHT EMITTING DIODES".

BACKGROUND

Light emitting diodes (LEDs) emit light when voltages are applied across their P/N junctions. During assembly, LEDs are bonded to LED packaging substrates through metal bonding pads. Conventional LED packaging substrates are often made of ceramic for various reasons, including reducing absorption of the emitted light by the LED packaging substrates. The performance of the conventional ceramic-based LED packaging substrates has not been entirely satisfactory. In addition, fabrication of these LED packaging substrates entails extra processing steps and added cost. For example, metal wire bonding pads on the ceramic substrate are often fabricated using different materials from the bonding pads on the LEDs, resulting in increased manufacturing complexity and cost. In another example, metal is difficult to deposit directly on ceramic LED packaging substrates, thereby necessitating an extra manufacturing step of depositing a buffer layer of copper on the ceramic substrates followed by metal plating. Accordingly, there is a need for LED packaging substrates that increase light extraction efficiency from the bonded LEDs, are tolerant of environmental factors, and can be easily and cost-effectively manufactured.

SUMMARY OF THE DISCLOSURE A package structure includes: a substrate having a first side and a second side opposite to the first side; a metal layer disposed over at least a portion of the second side of the substrate; a light-reflective layer disposed over the first side of the substrate; and a photonic device bonded to the light-reflective layer from the first side. A segment of the metal layer extends through the substrate from the first side to the second side, and a portion of the substrate is completely enclosed in a cross-sectional view by the metal layer. The package structure is free of a bonding wire over the second side of the substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1-7 show cross-sectional views of a semiconductor structure having light-emitting diode (LED) packaging substrate with a high reflective metal bonding at various fabrication stages constructed according to one or more embodiments of the present disclosure;

FIGS. 8-20 show cross-sectional views of a semiconductor structure having light-emitting diode (LED) packaging substrate with a high reflective metal bonding at various fabrication stages constructed according to one or more other embodiments of the present disclosure.

DETAILED DESCRIPTION

Figure 5:
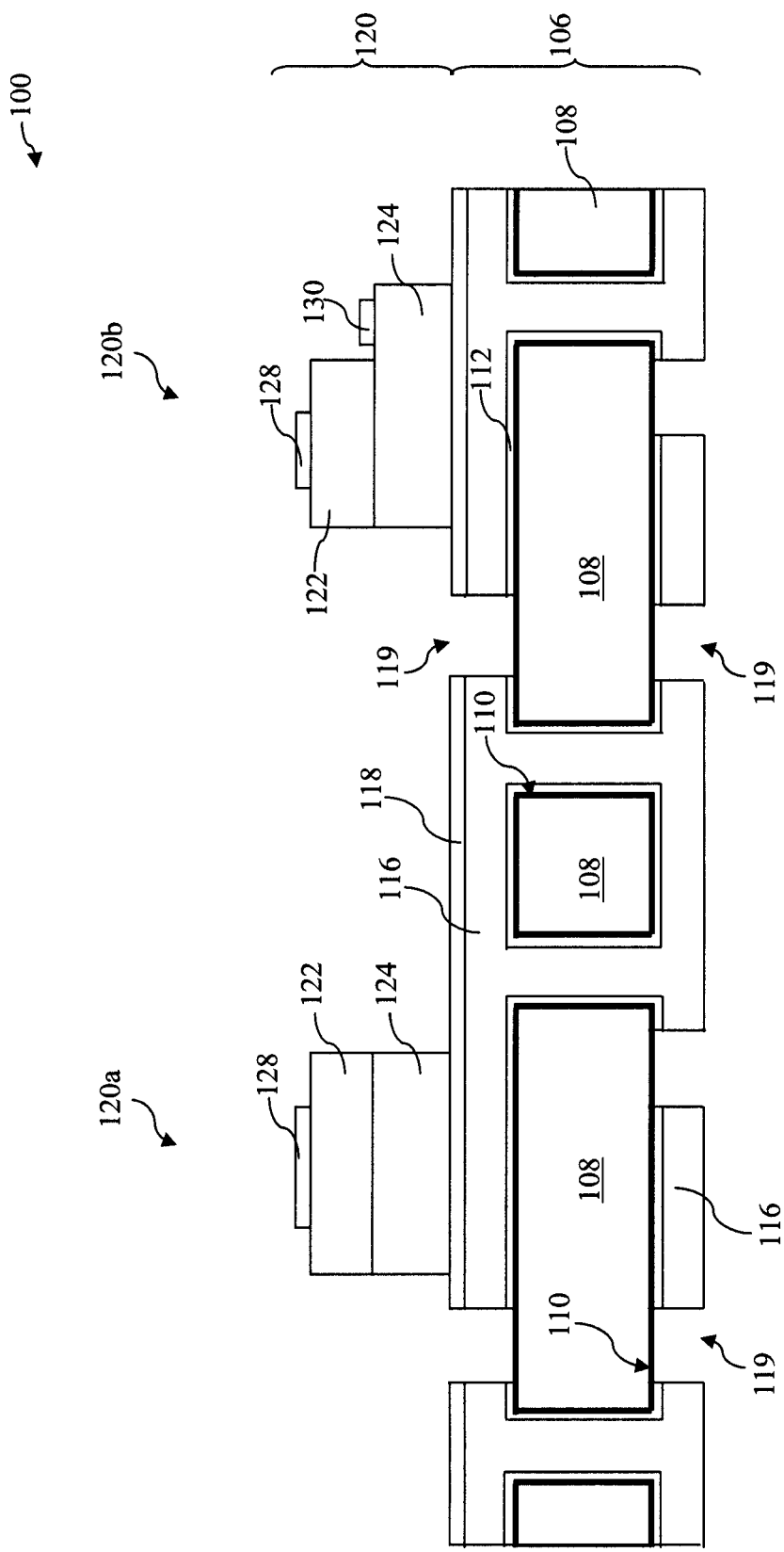

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIGS. 1-7 show cross-sectional views of a semiconductor structure 100 having a light-emitting diode (LED) packaging substrate with a high reflective metal bonding at various fabrication stages. With reference to FIGS. 1 through 7, the semiconductor structure 100 and a method of making the same are collectively described.

Referring to FIG. 1, a LED packaging substrate 106 is provided for packaging a plurality of LED dies at wafer level. In the present embodiment, the packaging substrate 106 includes a silicon substrate 108 such as a silicon wafer.

A plurality of thorough-silicon vias (TSVs) 109 are formed in the silicon substrate 108. The TSVs 109 are openings defined in the silicon substrate 108 and are designed for LED electrical routing in the packaging level. The TSVs 109 may be formed through the silicon substrate 108 by laser drilling or by another procedure including lithography patterning and etching.

A dielectric layer 110 is formed over both sides of the silicon substrate 108 and over the sidewalls of the TSVs 109 for isolation and passivation. In various embodiments, the dielectric layer 110 includes a dielectric material, such as silicon oxide, silicon nitride, silicon carbide, diamond-like carbon (DLC), ultra-nanocrystalline Diamond (UNCD), or aluminum nitride (AlN). In another embodiment, the dielectric layer 110 is deposited in a chemical vapor deposition (CVD) process over the silicon substrate 108. In yet another embodiment, the dielectric layer 110 includes silicon oxide formed by a thermal oxidation process.

Referring to FIG. 2, a barrier layer is formed over the dielectric layer 110. The barrier layer may include titanium (Ti) or titanium tungsten (TiW) and can be formed by a suitable process such as physical vapor deposition (PVD). The dielectric layer 110 and the barrier layer are formed over the sidewall surfaces of the TSVs to prevent a metal layer from diffusing into the packaging substrate 106. A seed metal layer such as copper (Cu) is also deposited over the barrier layer by a PVD process to serve as seed for subsequent plating. The barrier layer and the seed layer are formed on both sides of the silicon substrate 108. The barrier layer and seed layer are collectively referred to as the barrier/seed layer 112 as illustrated in FIG. 2. In the present embodiment, the dielectric layer 110 and the barrier/seed layer 112 includes a material stack of silicon oxide, titanium and copper.

Referring to FIG. 3, a patterned photo-resist layer 114 is formed over the barrier/seed layer 112 on both sides of the silicon substrate 108. In the present embodiment, the patterned photo-resist layer uses a dry film resist (DFR) that is laminated over the barrier/seed layer, and then patterned in a lithography process to define various openings. Particularly, the dry film resist is laminated on both sides of the silicon substrate 108.

A metal layer 116 is formed on both sides of the silicon substrate 108 and into the TSVs 109 to fill the TSVs, resulting in conductive TSV features. Those conductive TSV features are also simply referred to as TSVs without confusion. Those TSV features are conductive and are designed for electrical routing, and additionally for thermal dissipation. The metal layer 116 includes copper or other suitable metal. In the present embodiment, a plating process is implemented to form the metal layer 116. Thus, the metal layer 116 is self-aligned to the barrier/seed layer 112. In one example, the metal layer 116 of copper is metal plated over the copper seed layer using processes such as an electrochemical plating process.

Still referring FIG. 3, a highly reflective metal layer 118 is deposited only on one side of the silicon substrate 108. LED dies are to be bonded on that side, so referred to as LED side. Another side of the silicon substrate 108 is referred to as non-LED side or packaging side. The highly reflective metal layer 118 have a high reflection to effectively reflect light emitted from the bonded LEDs for LED emission efficiency. In the present embodiment, the highly reflective metal layer 118 includes aluminum (Al). Alternatively, the highly reflective metal layer 118 includes other suitable metal such as silver (Ag). In one embodiment, the highly reflective metal layer 118 is deposited by a process such as physical vapor deposition (PVD) rather than a metal plating process associated with conventional ceramic substrate. The highly reflective metal layer 118 is also formed on the patterned photo-resist layer 114 on the LED side of the silicon substrate 108.

Referring FIG. 4, the patterned photo-resist layer 114 is removed from both sides of the packaging substrate 106, defining openings 119 in the metal layer 116 on the packaging side and also defining other openings 119 in the metal layer 116 and the highly reflective metal layer 118 on the LED side. The DFR of the patterned photo-resist layer 114 may be removed in a chemical process to expose the barrier/seed layer 112. The portion of the highly reflective metal layer 118 over the patterned photo-resist layer 114 is lifted off during the removal of the patterned photo-resist layer 114, defining a plurality of highly reflective bonding pads (or bonding pads) on the LED sides of the silicon substrate 108. In one embodiment, the highly reflective bonding pads may include a subset as LED bonding pads for LED bonding and another subset as wire bonding pads for LED wiring.

In contrast, the metal layer 116 defines a plurality of metal pads on the packaging side of the silicon substrate 108. In the present embodiment, the metal pads are copper pads for bonding the packaging substrate 106 to a circuit board by a proper bonding method such as soldering.

Still referring to FIG. 4, an etching process is applied to remove the barrier/seed layer 112 within the openings 119 from both sides of the silicon substrate 108. The etching process may include wet etching and may include more than sub-steps with different etchants to effectively remove the barrier layer and the seed layer. By implementing the etching process, the highly reflective bonding pads on the LED side and the metal pads on the packaging side of the silicon substrate 108 are electrically disconnected from the adjacent pads. Thus, the packaging substrate 106 is prepared to LED packaging at wafer level.

Referring to FIG. 5, separated LED dies 120 are bonded to high reflective bonding pads on the LED side of the packaging substrate 106 for wafer level packaging. The bonding pads may be standalone bonding pads or may connect to TSVs for electrical coupling and thermal dissipation. The highly reflective metal layer 118 of the LED bonding pads reflects upward light emitted from the bonded LED dies 120. To facilitate bonding, bonding surface of the separated LED dies 120 may be deposited with the highly reflective metal before bonding to the LED bonding pads.

Each of the LED dies 120 includes a LED 122 and a carrier substrate 124. The LED 122 includes a n-type doped semiconductor layer and a p-type doped semiconductor layer configured as a PN junction designed to emit light during operation. In the present embodiment, the LED 122 further includes a multiple quantum well (MQW) sandwiched in the PN junction for tuned characteristic and enhanced performance.

Electrodes of the LED dies 120 can be designed and configured as vertical (two electrodes on both sides of the respective LED die), horizontal (or face-up, two electrodes on the same side of the respective LED die) or hybrid. In the present example, two LED dies 120a and 120b are provided for illustration purpose. The LED die 120a is vertical and the LED die 120b is horizontal.

The LED die 120a includes a first electrode 128. The carrier substrate 124 includes heavily doped silicon for both electrical and thermal conduction. The carrier substrate 124 may further includes a first metal film on one side to be bonded with the LED 122 and a second metal film on another side to be bonded to the high reflective bonding pad of the packaging substrate 106, collectively serving as a second electrode. In one example, the first electrode contacts the n-doped semiconductor layer of the LED 122 and the second electrode contacts the p-doped semiconductor layer of the LED 122.

The LED die 120b includes a first electrode 128 and a second electrode 130. In one example, the first electrode 128 contacts the n-doped semiconductor layer of the LED 122 and the second electrode contacts the p-doped semiconductor layer of the LED 122. The carrier substrate 124 includes silicon or alternatively the growth substrate such as sapphire.

Figure 6:
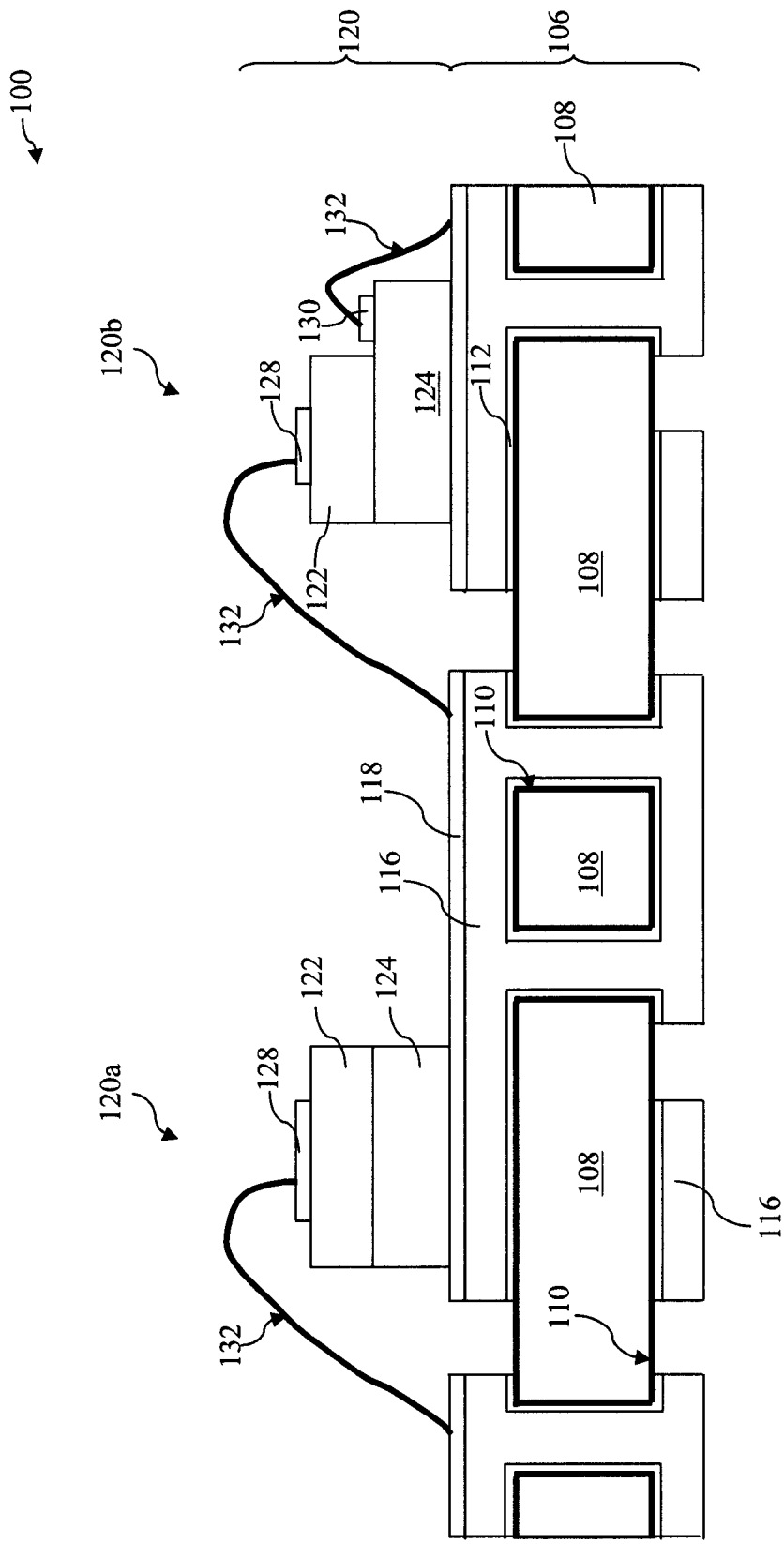

Referring to FIG. 6, bonding wires 132 are formed between the LED dies 120 and the wire bonding pads on the LED side of the packaging substrate 106. Particularly, for the LED die 120a in the vertical configuration, one wire contacts the respective electrode 128 and the respective wire bonding pad. For the LED die 120b in the horizontal configuration, one wire contacts the electrode 128 and the corresponding wire bonding pad and another wire contacts the electrode 130 and the corresponding LED bonding pad.

Figure 7:
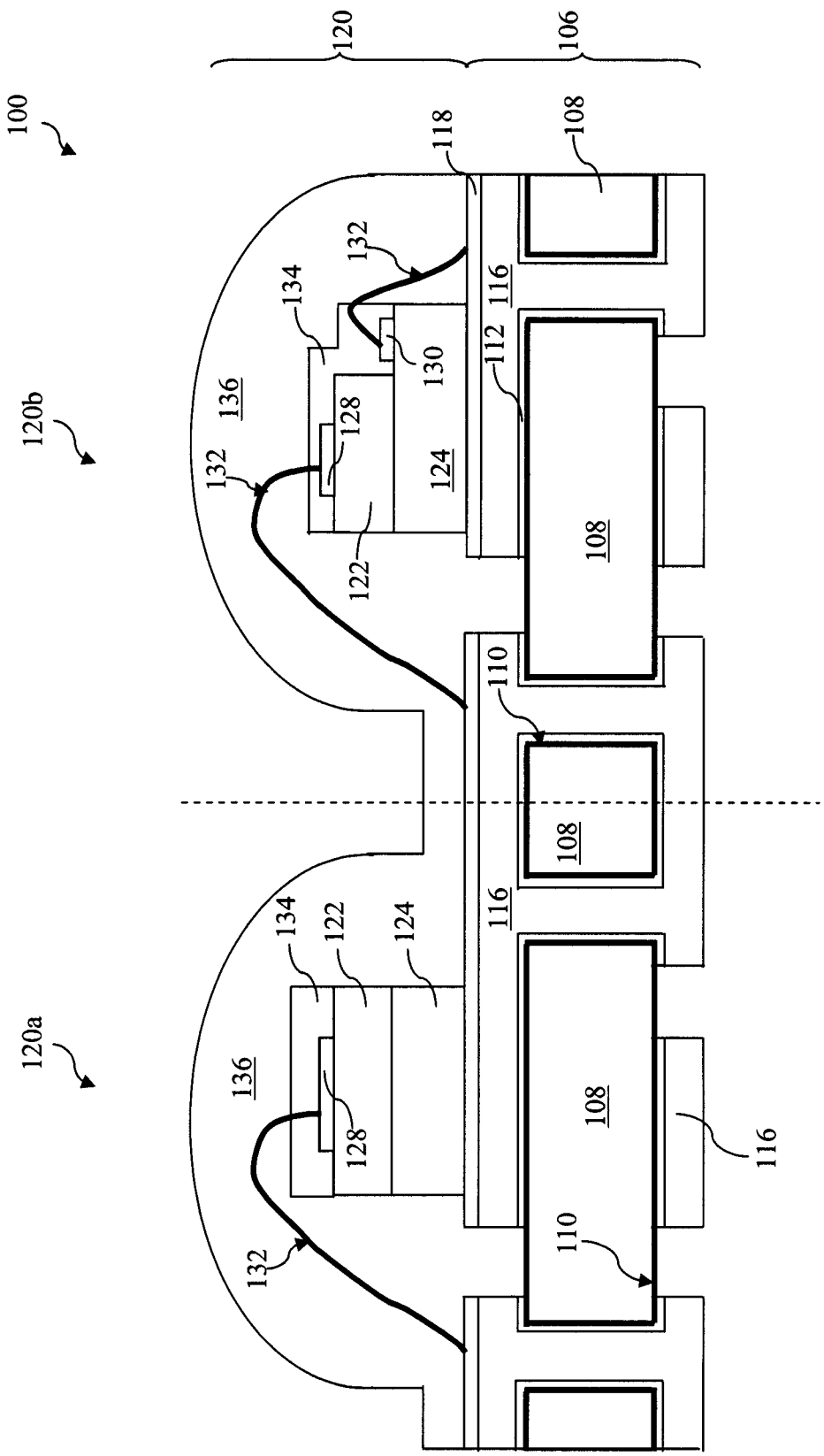

Referring to FIG. 7, phosphor 134 is distributed around the LED dies 120 to change the wavelength of the emitted light. In one embodiment, the phosphor embedded in a coating material is formed on the top surface of the LED dies 120. Phosphor coating may be deposited using a mask or through screen printing to form a surface phosphor layer on the top surface of the LED dies 120. Alternatively, phosphor coating may be deposited through a spray process to form a conformal phosphor layer to cover the top surface and also the side walls of the LED dies 120 to a uniform thickness.

Still referring to FIG. 7, a lens 136 is formed on the phosphor coating to further shape an emission pattern of the emitted light for enhanced light emission efficiency and directionality. In one embodiment, the lens 136 includes epoxy, silicone or other suitable material. The lens 136 may be formed by placing a lens molding over the LED dies, injecting silicone into the lens molding, and curing the injected silicone.

The LED dies 120 along with the packaging substrate 106 are diced into individual LED packages to complete the wafer level packaging process. The separated LED packages include individual LED dies 120 bonded with the diced packaging substrate 106.

In the semiconductor structure 100, the LED bonding pad is used for bonding the LED die to the packaging substrate and is also used as a reflector layer to increase efficiency of light extraction from the LED die. In addition, the wire bonding pads are used to electrically connect the LED die to the packaging substrate, simplifying the fabrication of the packaging substrate. In addition to providing a packaging substrate for wafer level packaging, the silicon substrate is selected for its high thermal conductivity to provide improved thermal dissipation from the bonded LED dies.

FIGS. 8-20 show cross-sectional views of a semiconductor structure 140 having a light-emitting diode (LED) packaging substrate with a high reflective metal layer at various fabrication stages constructed according to other embodiments of the present disclosure. With reference to FIGS. 8 through 20, the semiconductor structure 140 and a method of making the same are collectively described.

Referring to FIG. 8, a LED packaging substrate 106 is provided for packaging a plurality of LED emitter at wafer level. In the present embodiment, the packaging substrate 106 includes a silicon substrate 108 such as a silicon wafer.

A plurality of trenches (or blind vias) 109 are formed in the silicon substrate 108. The blind vias 109 are not through openings and are designed for LED electrical routing in the packaging level after subsequent fabrication steps. The blind vias are formed on the packaging side (or non-LED side). The blind vias 109 may further provide thermal conduction for dissipating heat generated from of the LED dies. The blind vias may be formed in the silicon substrate 108 by laser drilling or by a procedure including lithography patterning and etching.

A dielectric layer 110 is formed over the packaging side of the packaging substrate 108 and over the sidewalls of the blind vias 109. In various embodiments, the dielectric layer 110 includes a dielectric material, such as silicon oxide, silicon nitride, silicon carbide, DLC, UNCD, or AlN. In one embodiment, the dielectric layer 110 is deposited in a CVD process over the silicon substrate 108. In another embodiment, the dielectric layer 110 includes silicon oxide formed by a thermal oxidation process.

Referring to FIG. 9, a barrier layer is formed over the dielectric layer 110. The barrier layer may include Ti, TiW or other suitable material and can be formed by a process such as PVD. The dielectric layer 110 and the barrier layer are formed over the sidewall surfaces of the blind vias 109 to prevent a metal layer from diffusing into the silicon substrate 108. A seed metal layer such as Cu is further deposited over the barrier layer by a PVD process to serve as seed for subsequent plating. The barrier layer and the seed layer are formed only on the packaging side of the silicon substrate 108 and into the blind vias 109. The barrier layer and seed layer are collectively referred to as the barrier/seed layer 112 as illustrated in FIG. 9. In the present embodiment, the dielectric layer 110 and the barrier/seed layer 102 includes a material stack of silicon oxide, titanium and copper.

Still referring to FIG. 9, a patterned photo-resist layer 114 is formed over the barrier/seed layer 112 on the packaging side of the silicon substrate 108. In the present embodiment, the patterned photo-resist layer uses a dry film resist that is laminated over the barrier/seed layer, and then patterned in a lithography process to define various openings.

Referring to FIG. 10, a metal layer 116 is formed on the packaging side of the silicon substrate 108 and into the blind vias 109 to fill the blind vias. The metal layer 116 includes copper or other suitable metal formed by metal plating. Thus, the metal layer 116 is self-aligned to the barrier/seed layer 112. In one example, the metal layer 116 is a copper layer that is metal plated over the copper seed layer using processes such as an electrochemical plating process.

Referring to FIG. 11, the patterned photo-resist layer 114 is removed from the packaging side of the silicon substrate 108, defining openings 119 in the metal layer 116. The patterned photo-resist layer 114 may be removed in a chemical process. The barrier/seed layer 112 within the openings 119 is exposed. The metal layer 116 defines a plurality of metal pads on the packaging side of the silicon substrate 106. In the present embodiment, the metal pads are copper pads for bonding the packaging substrate 106 to a circuit board by a proper bonding method such as soldering.

Figure 12:
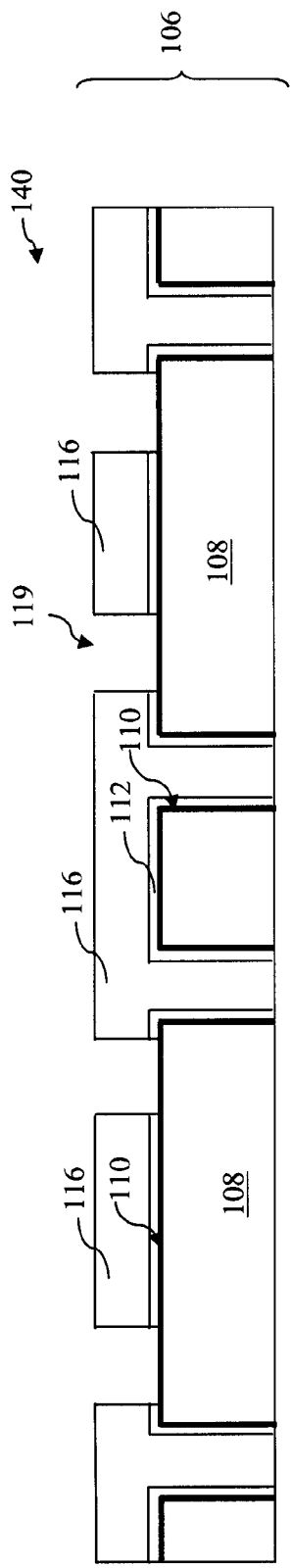

Referring to FIG. 12, an etching process is applied to remove the barrier/seed layer 112 exposed within the openings 119 from the packaging side of the silicon substrate 108. The etching process may include wet etching and may include more than sub-steps with different etchants to effectively remove the barrier layer and the seed layer. By implementing the etching process, the metal pads are electrically disconnected from the adjacent pads.

Still referring to FIG. 12, the LED side of the silicon substrate 108 is thinned to reach the metal layer 116 of the blind vias. Thinning of the silicon substrate 108 also removes the dielectric layer and the barrier/seed layer from the LED side of the silicon substrate 108. The silicon substrate 106 may be thinned through processes such as grinding, lapping, or chemical mechanical polishing.

Figure 13:
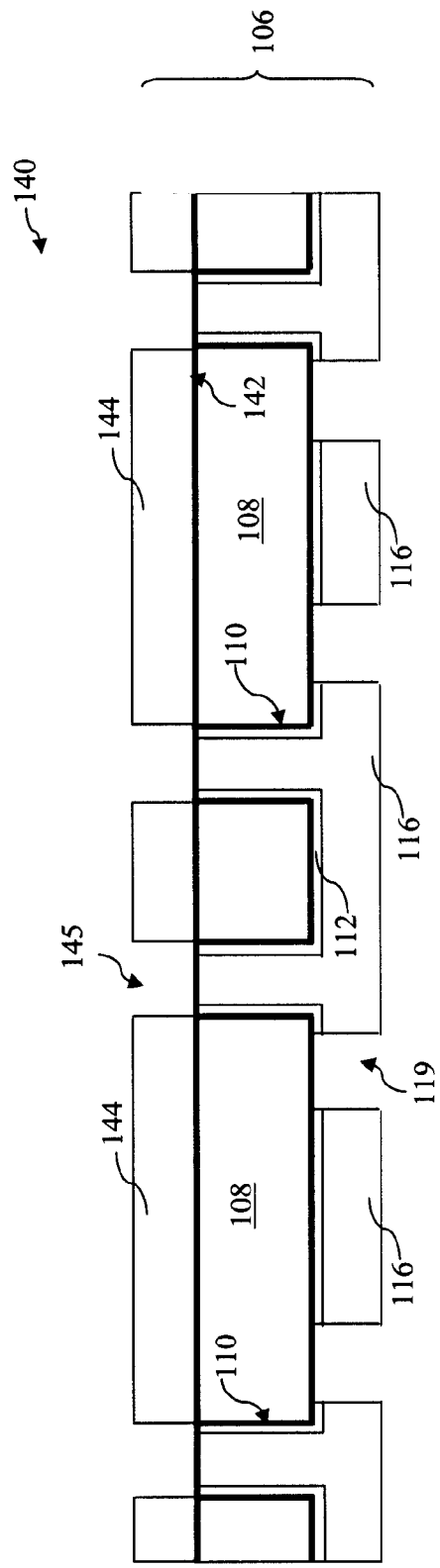

Referring to FIG. 13, a dielectric layer 142 is deposited over the LED side of the silicon substrate 108. The dielectric layer 142 deposited over the LED side may be the same as the dielectric layer 110. The dielectric layer 142 serves as an electrical isolation/passivation layer and may be deposited in a CVD process. The dielectric layer 142 on the LED side connects with dielectric layer 110 to form an isolation layer surrounding the silicon substrate 108. Note that the packaging substrate 106 is flipped in FIG. 13 for proper illustration.

Still referring to FIG. 13, a patterned photo-resist layer 144 is formed over the dielectric layer 142 on the LED side of the silicon substrate 108. The patterned photo-resist layer 144 defines openings 145 aligned with the blind vias. The patterned photo-resist layer 144 is similar to the patterned photo-resist layer 114 in terms of composition and formation.

Figure 14:
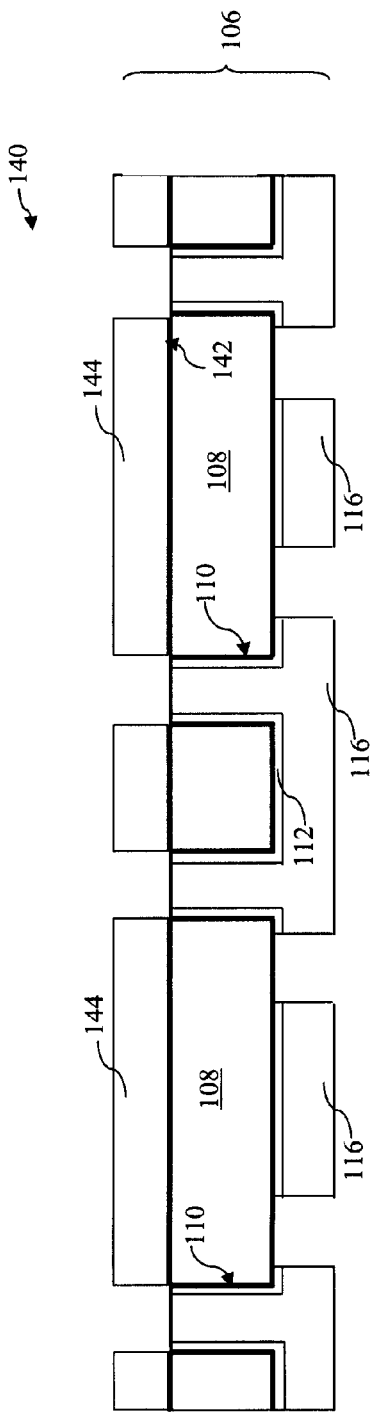

Referring to FIG. 14, the dielectric layer 142 exposed within the openings of the patterned photo-resist layer 144 is removed from the LED side of the silicon substrate 108. The exposed dielectric layer may be removed in an etching process using the patterned photo-resist layer 144 as an etch mask. After the removal, the dielectric layer 142 exposes the metal layer of the blind vias. Thus, the blind vias are turned into TSVs (through silicon vias).

Figure 15:
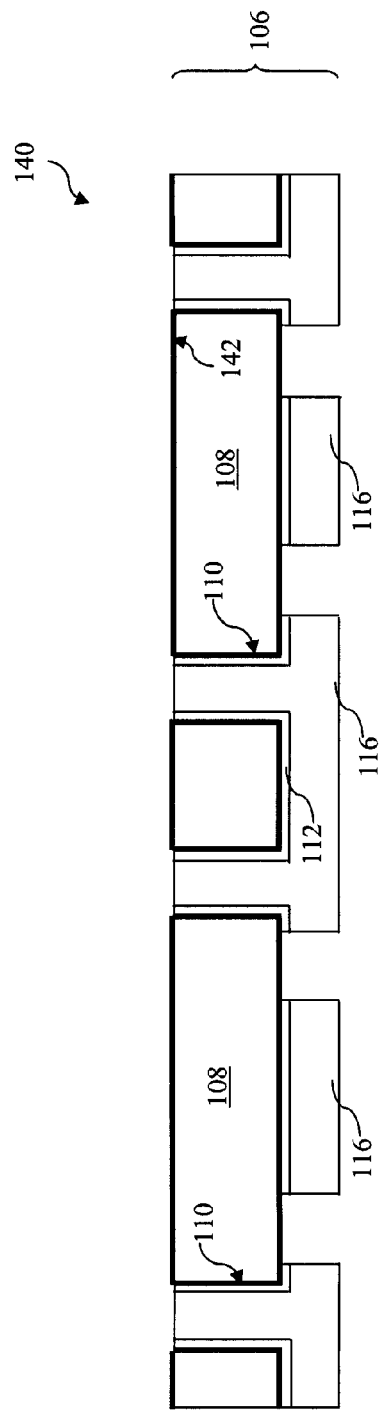

Referring to FIG. 15, the patterned photo-resist layer 144 is removed. The formation of the dielectric layer 142 includes various processing steps from FIGS. 13-15, including deposition, lithography patterning and etching. The dielectric layer 142 can be alternatively formed by another procedure. For example, if silicon oxide is used for the dielectric layer 142, a thermal oxidation process can be applied to the silicon substrate 108 to form silicon oxide self-aligned to the silicon surface and exposing the blind vias. Thus lithography patterning and etching are eliminated.

Figure 16:
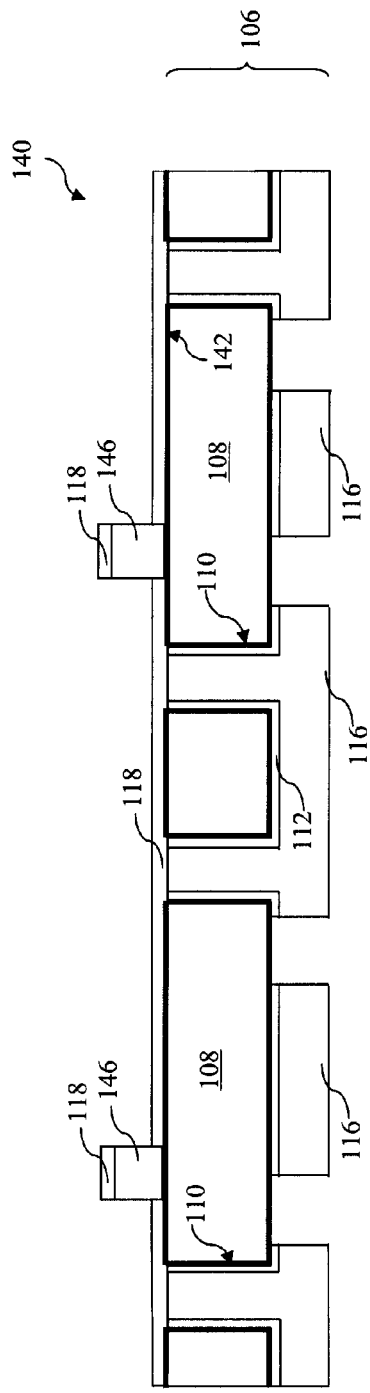

Referring to FIG. 16, another patterned photo-resist layer 146 is formed over the dielectric layer 142 on the LED side of the silicon substrate 108. In the present embodiment, the patterned photo-resist layer 146 is similar to the patterned photo-resist layer 114 in terms of composition and formation.

Still referring to FIG. 16, a highly reflective metal layer 118 is deposited only on the LED side of the packaging substrate 106. In the present embodiment, the highly reflective metal layer 118 includes Al, or alternatively other suitable metal such as Ag. In one embodiment, the highly reflective metal layer 118 is deposited by a process such as PVD.

In the present embodiment, the highly reflective metal layer 118 is deposited directly over the dielectric layer 142 on the LED side, eliminating the need for depositing a barrier/seed layer over the dielectric layer 142. Because there is no barrier/seed layer or metal layer to etch, etching undercuts to the highly reflective metal layer is avoided. The highly reflective metal layer 118 is also deposited over the metal layer 116 in the TSVs and the patterned photo-resist layer 146.

Figure 17:
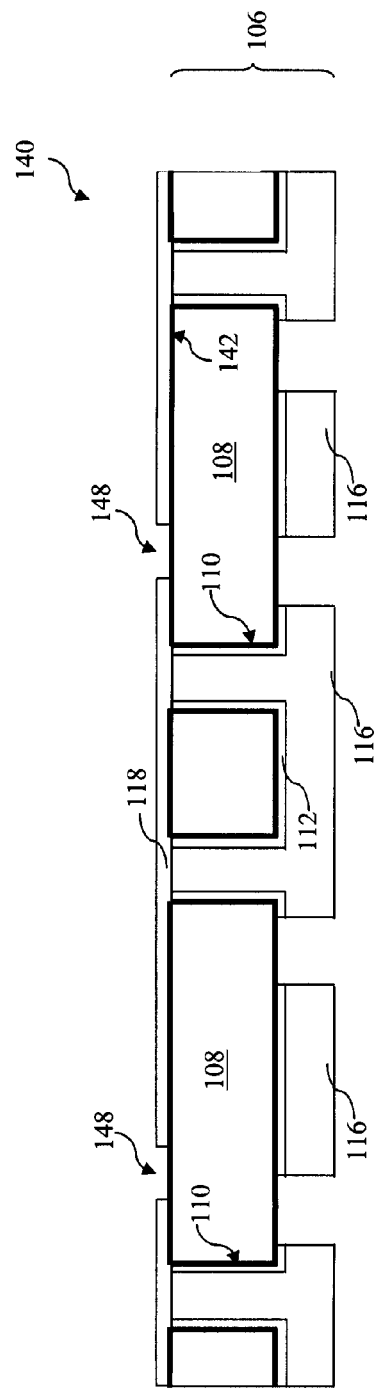

Referring FIG. 17, the patterned photo-resist layer 146 is removed from the silicon substrate 108, defining openings 148 in the highly reflective metal layer 118 on the LED side. The patterned photo-resist layer 146 may be removed by wet etching. The portion of the highly reflective metal layer 118 over the patterned photo-resist layer 146 is lifted off during the removal of the patterned photo-resist layer 146, defining a plurality of highly reflective bonding pads on the LED sides of the silicon substrate 108. The highly reflective bonding pads may include a subset as LED bonding pads for LED bonding and another subset as wire bonding pads for LED wiring.

Figure 18:
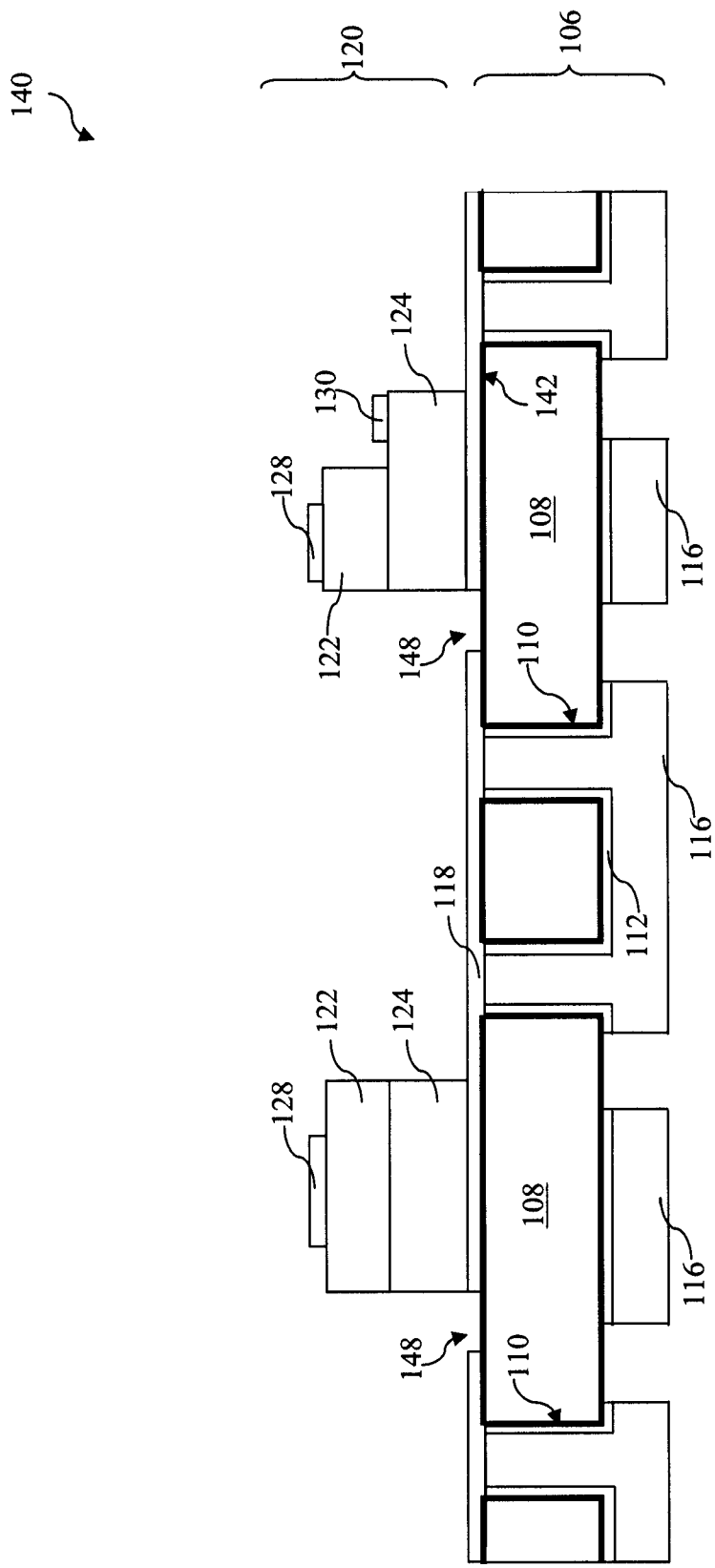

Referring to FIG. 18, separated LED dies 120 are bonded to the LED bonding pads on the LED side of the silicon substrate 108 at wafer level. The highly reflective metal layer 118 of the LED bonding pads reflect upward light emitted from the bonded LED dies 120. To facilitate bonding, bonding surface of the separated LED dies 120 may be deposited with the highly reflective metal before bonding to the LED bonding pads.

The LED dies 120 are similar to those LED dies 20 in FIG. 5. For example, each of the LED dies 120 includes a LED 122 and a carrier substrate 124. The LED 122 includes a n-type doped semiconductor layer and a p-type doped semiconductor layer configured as a PN junction designed to emit light during operation. In the current embodiment, the LED 122 may further include a MQW sandwiched in the PN junction.

Electrodes of the LED dies 120 can be designed and configured as vertical, horizontal or hybrid. In the present example, two LED dies 120a and 120b are provided for illustration purpose. The LED die 120a is vertical and the LED die 120b is horizontal.

The LED die 120a includes a first electrode 128. The carrier substrate 124 includes heavily doped silicon for both electrical and thermal conduction. The carrier substrate 124 may further includes a first metal film on one side to be bonded with the LED 122 and a second metal film on another side to be bonded to the high reflective bonding pad of the packaging substrate 106, serving as a second electrode. In one example, the first electrode contacts the n-doped semiconductor layer of the LED 122 and the second electrode contacts the p-doped semiconductor layer of the LED 122.

The LED die 120b includes a first electrode 128 and a second electrode 130. In one example, the first electrode 128 contacts the n-doped semiconductor layer of the LED 122 and the second electrode contacts the p-doped semiconductor layer of the LED 122. The carrier substrate 124 includes silicon or alternatively the growth substrate such as sapphire.

Subsequent packaging steps are similar to those illustrated through FIGS. 6 and 7. In the present embodiment, the subsequent packaging steps include wire bonding, forming phosphor and lens, and dicing as explained below.

Figure 19:
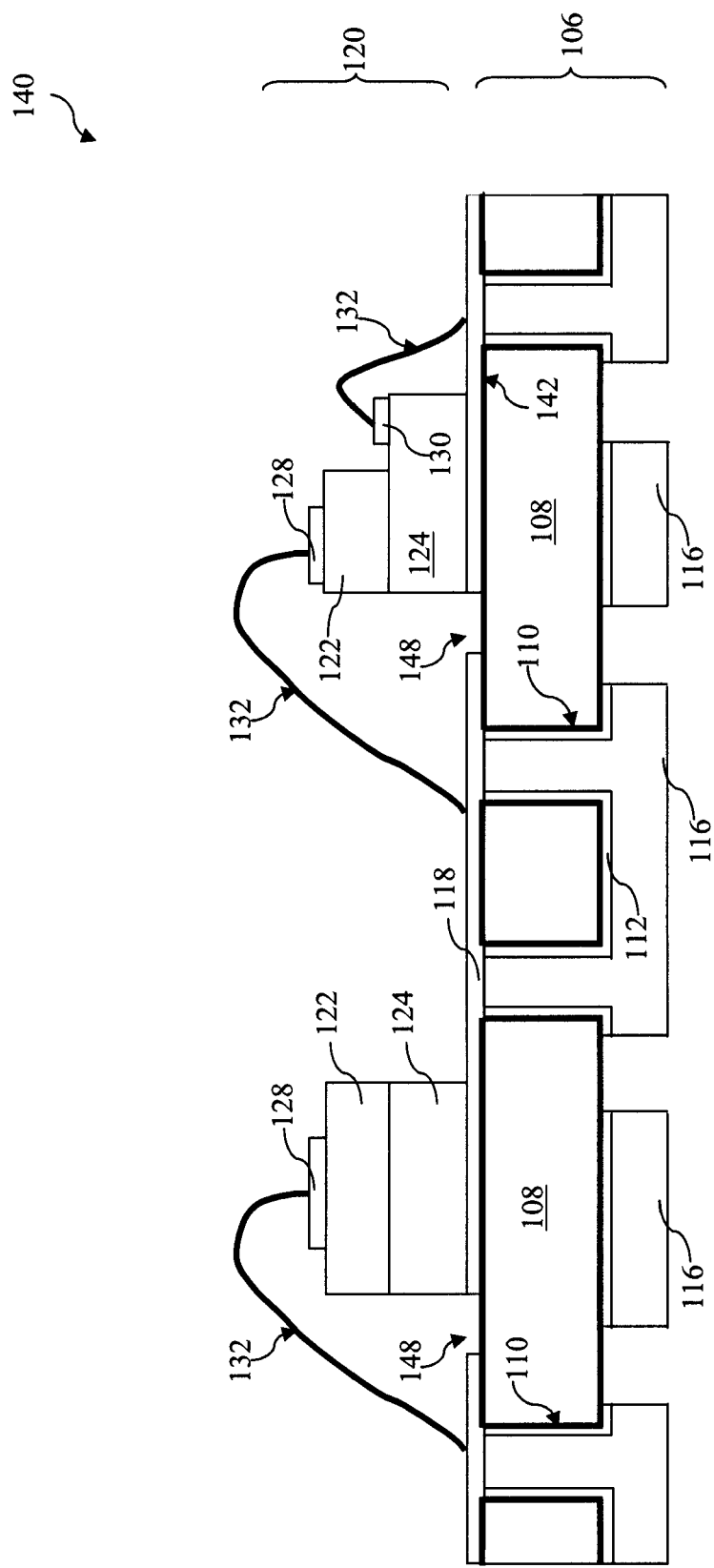

Referring to FIG. 19, bonding wires 132 are formed between the LED dies 120 and the wire bonding pads on the LED side of the packaging substrate 106. Particularly, for the LED die 120a in the vertical configuration, one wire contacts the electrode 128 and the corresponding wire bonding pad. For the LED die 120b in the horizontal configuration, one wire contacts the electrode 128 and the respective wire bonding pad and another wire contacts the electrode 130 and the respective LED bonding pad.

Figure 20:
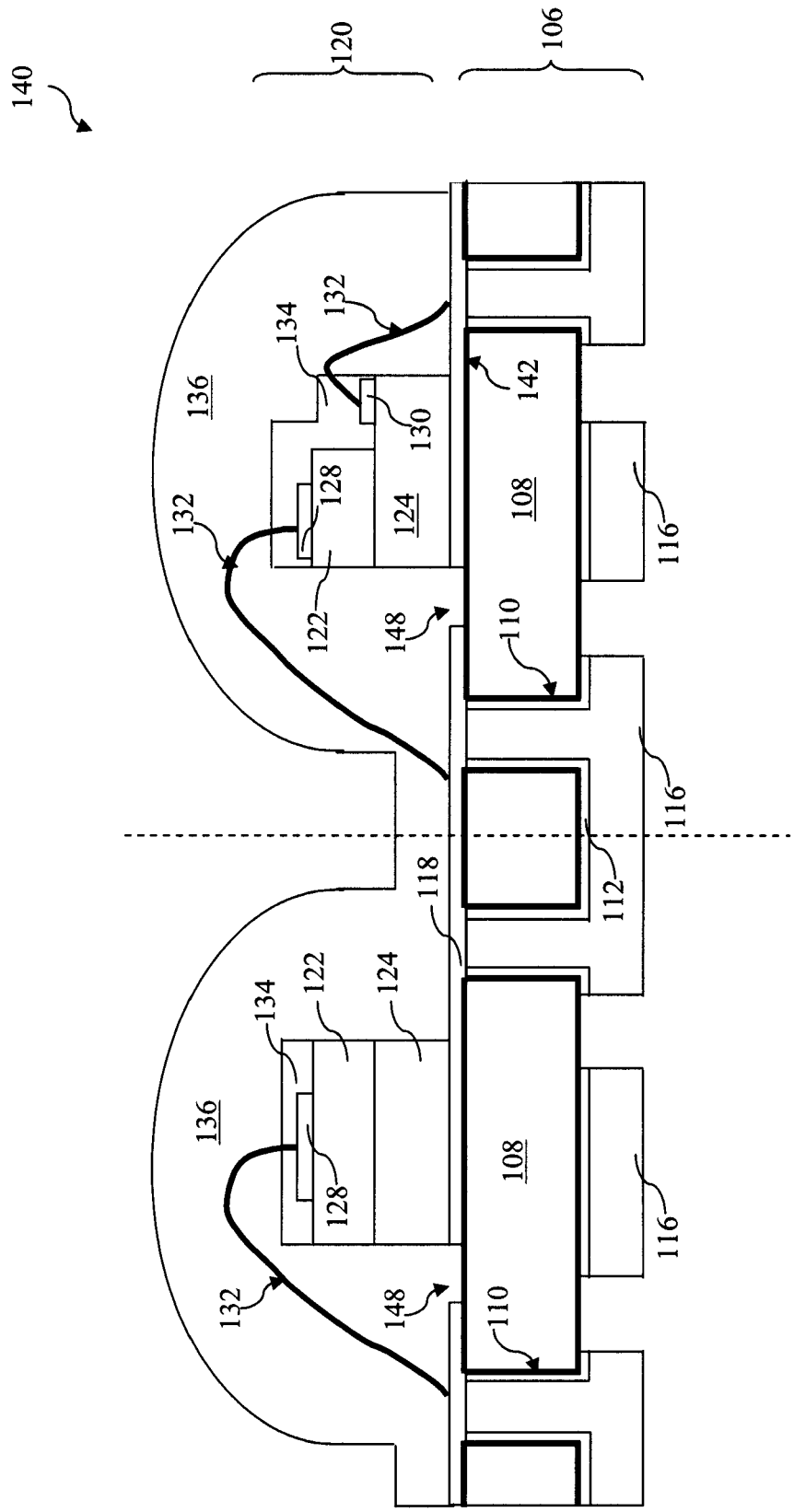

Referring to FIG. 20, phosphor 134 is distributed around the LED dies 120 to change the wavelength of the emitted light. In one embodiment, the phosphor embedded in a coating material is formed on the top surface of the LED dies 120. Phosphor coating may be deposited using a mask or through screen printing or alternatively through a spray process.

Still referring to FIG. 20, a lens 136 is formed on the phosphor coating. In one embodiment, the lens 136 includes epoxy, silicone or other suitable material. In one example, the lens 136 may be formed by placing a lens molding over the LED dies, injecting silicone into the lens molding, and curing the injected silicone.

The LED dies 120 along with the packaging substrate 106 are diced into individual LED packages to complete the wafer level packaging process. The separated LED packages include individual LED dies 120 bonded with the diced packaging substrate 106.

Figure 21:
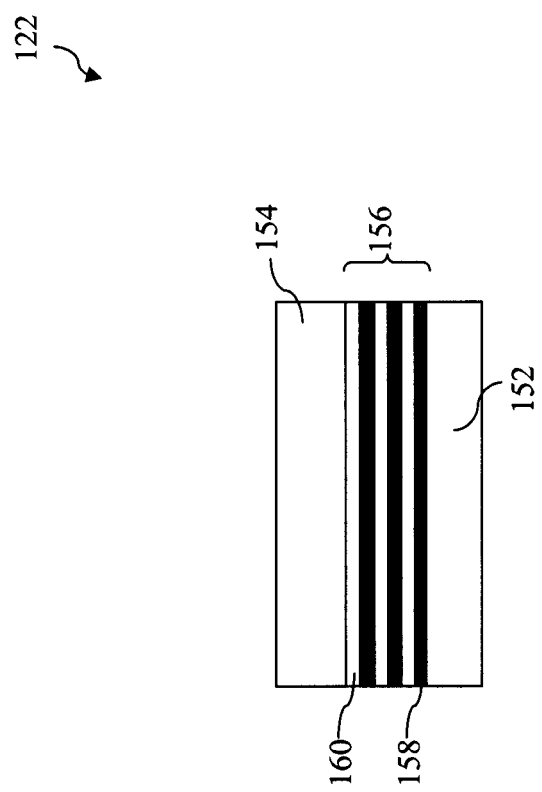
FIG. 21 shows a cross-sectional view of a LED incorporated in the semiconductor structure of FIG. 1-7 or 8-20 according to various embodiments of the present disclosure.

FIG. 21 illustrates a sectional view of the LED 122 according to various embodiments of the present disclosure. The LED 122 can be incorporated in the semiconductor structure 100 or 140. The LED 122 includes a p-type doped semiconductor layer 152 and a n-type doped semiconductor layer 154 configured as a PN junction designed to emit light during operation. In one embodiment, the p-type and n-type doped semiconductor layers 152 and 154 includes respectively doped gallium nitride (GaN) layers.

The LED 122 further includes a multiple quantum well (MQW) 156 interposed between the n-type and p-type doped semiconductor layers for tuned LED characteristic and enhanced performance. The MQW 156 includes a stack of two alternating semiconductor material films 158 and 160. In one example, the two semiconductor material films 158 and 160 include an indium gallium nitride (InGaN) and gallium nitride (GaN), respectively. Various semiconductor layers can be grown by proper epitaxy growth technique. In one example, the epitaxial semiconductor layers are deposited by metal organic chemical vapor deposition (MOCVD).

Although, the semiconductor structure having LED dies packaged at wafer level and the method making the same are described according various embodiments of the present disclosure, other alternative, replacement or modification may present without departure from the spirit of the present disclosure. In one embodiment, bonding the LED dies to the packaging substrate also includes forming a thermal conductive path for transferring heat away from each of the separated LED dies. In yet another embodiment, the packaging substrate 106 is removed before dicing the plurality of separated LED dies 120 into the plurality of LED packages. In yet another embodiment of the LED dies, the n-type doped layer and the p-type doped layer can be switched such that the top electrode contacts the p-type doped layer and the bottom electrode contacts the n-type doped layer. In yet another embodiment, the carrier substrate may be eliminated from the LED dies. In yet another embodiment, the LED dies packaging may not be limited to wire bonding. Although the wiring connection is used for electrical coupling from each LED die to the packaging substrate in the present embodiment, other electrical coupling technique, such as micro-interconnects described in the commonly assigned US application titled "MICRO-INTERCONNECTS FOR LIGHT EMITTING DIODES" (see Cross Reference), may be used with the LED packaging substrate 106 of the semiconductor structure 100 or the LED packaging substrate 106 of the semiconductor structure 140.

Thus, the present disclosure provides a method The method includes forming a plurality of through silicon vias (TSVs) on a silicon substrate; depositing a dielectric layer over a first side and a second side of the silicon substrate and over sidewall surfaces of the TSVs; forming a metal layer patterned over the dielectric layer on the first side and the second side of the silicon substrate and further filling the TSVs; and forming a plurality of highly reflective bonding pads over the metal layer on the second side of the silicon substrate for LED bonding and wire bonding.

The present disclosure also provides another embodiment of a method for fabricating a LED packaging substrate. The method includes forming a plurality of blind vias on a first side of a silicon substrate; depositing a first dielectric layer over the first side of the silicon substrate and over sidewalls surfaces of the blind vias; depositing a metal layer over the first dielectric layer and into the blind vias to fill the blind vias; thinning a second side of the silicon substrate to expose the metal layer in the blind vias; forming a second dielectric layer over the second side of the silicon substrate and patterned to expose the metal layer in the blind vias; forming a patterned photo-resist layer over the second dielectric layer; forming a highly reflective metal layer over the second dielectric layer and over the exposed metal layer in the blind vias; and removing the patterned photo-resist layer to form a plurality of highly reflective bonding pads and a plurality of highly reflective wire bonding pads on the second side of the silicon substrate.

The present disclosure also provides one embodiment of a LED packaging substrate. The LED packaging substrate includes a silicon substrate, wherein a first side and a second side of the silicon substrate is covered with a dielectric layer and wherein a plurality of highly reflective LED bonding pads and a plurality of highly reflective wire bonding pads are disposed on the dielectric layer on the second side of the silicon substrate; and a plurality of TSVs (through silicon vias) in the silicon substrate, wherein sidewall surfaces of the TSVs are covered with the dielectric layer, and wherein each of the TSVs connects with one of the highly reflective LED bonding pads or the highly reflective wire bonding pads on the second side of the silicon substrate and also connects with a metal pad on the first side of the silicon substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A package structure, comprising:
    a substrate having a first side and a second side opposite to the first side;
    a metal layer disposed over at least a portion of the second side of the substrate, wherein a segment of the metal layer extends through the substrate from the first side to the second side, and wherein a portion of the substrate is completely enclosed in a cross-sectional view by the metal layer;
    a light-reflective layer disposed over the first side of the substrate; and
    a photonic device bonded to the light-reflective layer from the first side;
    wherein the package structure is free of a bonding wire over the second side of the substrate.

2. The package structure of claim 1, wherein a portion of the metal layer is disposed on the first side of the substrate, and wherein the light-reflective layer is disposed on the portion of the metal layer.

3. The package structure of claim 1, wherein the photonic device is bonded to the light-reflective layer through a carrier substrate.

4. The package structure of claim 1, further comprising a dielectric layer disposed between the substrate and the metal layer.

5. The package structure of claim 1, wherein the photonic device includes a light-emitting diode die.

6. The package structure of claim 1, wherein:
    the substrate contains silicon;
    the metal layer contains copper; and
    the light-reflective layer contains aluminum or silver.

7. The package structure of claim 1, further comprising:
    an electrode disposed over and electrically coupled to the photonic device;
    a phosphor layer disposed over the electrode and at least partially over the photonic device; and
    a lens disposed over the substrate, wherein the photonic device is encapsulated by the lens.

8. The package structure of claim 1, wherein:
    the light-reflective layer includes a plurality of segments separated by a plurality of openings; and
    the photonic device is bonded to a first segment of the plurality of segments of the light-reflective layer.

9. The package structure of claim 8, wherein the photonic device is a first photonic device; and further comprising: a second photonic device bonded to a second segment of the plurality of segments of the light-reflective layer.

10. The package structure of claim 9, wherein the first photonic and the second photonic device are electrically coupled together by a bonding wire over the first side of the substrate.

11. A light-emitting diode (LED) packaging structure, comprising:
    a substrate having a front side and a back side;
    a metal layer that circumferentially surrounds in 360 degrees at least a portion of the substrate in a cross-sectional view;
    a plurality of bonding pads disposed over the front side of the substrate, the bonding pads each containing a light-reflective material, wherein the metal layer is disposed between the substrate and the bonding pads;

a plurality of LED dies each bonded to a respective one of the bonding pads;

a plurality of electrodes each disposed on a respective one of the LED dies; and a plurality of bonding wires electrically coupling the LED dies together, wherein for each bonding wire has one distal end is attached to a respective one of the bonding pads, and another opposite distal end is attached to the electrode of an adjacent LED die.

12. The LED packaging structure of claim 11, wherein the packaging structure is free of bonding wires on the back side.

13. The LED packaging structure of claim 11, further comprising a plurality of lenses disposed over the front side of the substrate, wherein each lens covers a respective one of the LED dies.

14. The LED packaging structure of claim 11, further comprising a plurality of conductive through-silicon-via (TSV) features extending through the substrate from the front side to the back side, wherein each of the TSV features is electrically coupled to a respective one of the bonding pads.

15. A light-emitting diode (LED) packaging structure, comprising:

a packaging substrate having a front surface and a back surface;

a metal element that completely surrounds a segment of the packaging substrate, wherein the metal element includes a plurality of conductive through-silicon-via (TSV) features extending through the packaging substrate from the front surface to the back surface;

a first reflective pad and a second reflective pad each located over the front surface of the packaging substrate, wherein the first and second reflective pads are configured to reflect radiation and are physically separated from each other;

a first LED die and a second LED die bonded to the first reflective pad and the second reflective pad, respectively; and a bonding wire having first and second opposite ends, wherein the first end is bonded to the first reflective pad, and the second end is bonded to the second LED die.

16. The LED packaging structure of claim 15, further comprising:

a first electrode located on the first LED die;

a second electrode located on the second LED die; and the second end of the bonding wire is bonded to the second electrode.

17. The LED packaging structure of claim 15, further comprising: a first lens and a second lens located over the first LED die and the second LED die, respectively.

18. The LED packaging structure of claim 15, wherein the first and second LED dies are bonded to the first reflective pad and the second reflective pad through respective carrier substrates.

19. The LED packaging structure of claim 15, wherein:

the TSV features divide the packaging substrate into a plurality of substrate segments; and each substrate segment is surrounded by a respective dielectric layer.

20. The LED packaging structure of claim 19, wherein the dielectric layer is disposed within the metal element.

* * * * *